(12) United States Patent
Hsiao

(10) Patent No.: US 8,317,274 B2
(45) Date of Patent: Nov. 27, 2012

(54) FRAME SECTION AND SWITCHING CABINET USING THE SAME

(75) Inventor: Yi-Liang Hsiao, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 125 days.

(21) Appl. No.: 12/853,567

(22) Filed: Aug. 10, 2010

(65) Prior Publication Data

US 2011/0181161 A1  Jul. 28, 2011

(30) Foreign Application Priority Data

Jan. 22, 2010  (TW) .............................. 99101718 A

(51) Int. Cl.
*A47B 81/00* (2006.01)
*A47B 77/06* (2006.01)
*A47G 29/00* (2006.01)
*H02B 1/01* (2006.01)

(52) U.S. Cl. .................. 312/223.1; 312/229; 312/265.3; 361/832

(58) Field of Classification Search .... 312/265.1–265.4, 312/223.1, 100, 257.1; 211/26; 361/797, 361/724–727
See application file for complete search history.

(56) References Cited

U.S. PATENT DOCUMENTS

| | | | |
|---|---|---|---|
| 2,686,704 A * | 8/1954 | Wolters | 312/257.1 |
| 5,228,762 A * | 7/1993 | Mascrier | 312/265.4 |
| 5,292,189 A * | 3/1994 | Lau et al. | 312/265.3 |
| 5,308,115 A * | 5/1994 | Ruehl et al. | 280/785 |
| 5,941,621 A * | 8/1999 | Boulay et al. | 312/334.4 |
| 5,957,555 A * | 9/1999 | Kohler et al. | 312/100 |
| 6,036,290 A * | 3/2000 | Jancsek et al. | 312/265.4 |
| 6,102,498 A * | 8/2000 | Kohler et al. | 312/223.1 |
| 6,363,669 B1 * | 4/2002 | Hoffman | 52/202 |
| 2003/0034717 A1 * | 2/2003 | Yao | 312/223.1 |
| 2004/0020874 A1 * | 2/2004 | Haney | 211/26 |
| 2004/0182799 A1 * | 9/2004 | Tachibana | 211/26 |
| 2004/0218368 A1 * | 11/2004 | Velez et al. | 361/727 |
| 2007/0175836 A1 * | 8/2007 | Bumeder et al. | 211/26 |
| 2008/0218042 A1 * | 9/2008 | Hartel et al. | 312/265.4 |
| 2008/0272677 A1 * | 11/2008 | Francisquini | 312/257.1 |

* cited by examiner

*Primary Examiner* — David Dunn
*Assistant Examiner* — Ryan A Doyle
(74) *Attorney, Agent, or Firm* — Altis Law Group, Inc.

(57) ABSTRACT

An exemplary switching cabinet includes a rack. The rack includes four vertical braces. Each of the vertical braces includes a main body having an open inner lateral side. The main body includes a main plate and two extending plates extending from two opposite lateral sides of the main plate in a same direction. A first flange and a second flange extend oppositely and outwardly from free sides of the extending plates.

8 Claims, 7 Drawing Sheets

FRAME SECTION AND SWITCHING CABINET USING THE SAME

CROSS-REFERENCE TO RELATED APPLICATION

This patent application is related to a co-pending U.S. patent application, titled "SWITCHING CABINET AND ASSEMBLY METHOD OF THE SAME", with the application Ser. No. 12/852,245, assigned to the same assignee, and disclosure of which is incorporated herein by reference in its entirety.

BACKGROUND

1. Technical Field

The disclosure relates to a frame section for a switching cabinet, and to a switching cabinet using the frame section of this type.

2. Description of Related Art

A typical switching cabinet includes a cuboid rack. The rack consists of several frame sections. The frame sections each have a closed cross-section, resulting in high manufacturing cost and heavy switching cabinets.

What is needed, therefore, is a frame section which overcomes the above-mentioned limitations, and a switching cabinet using the frame section of this type.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
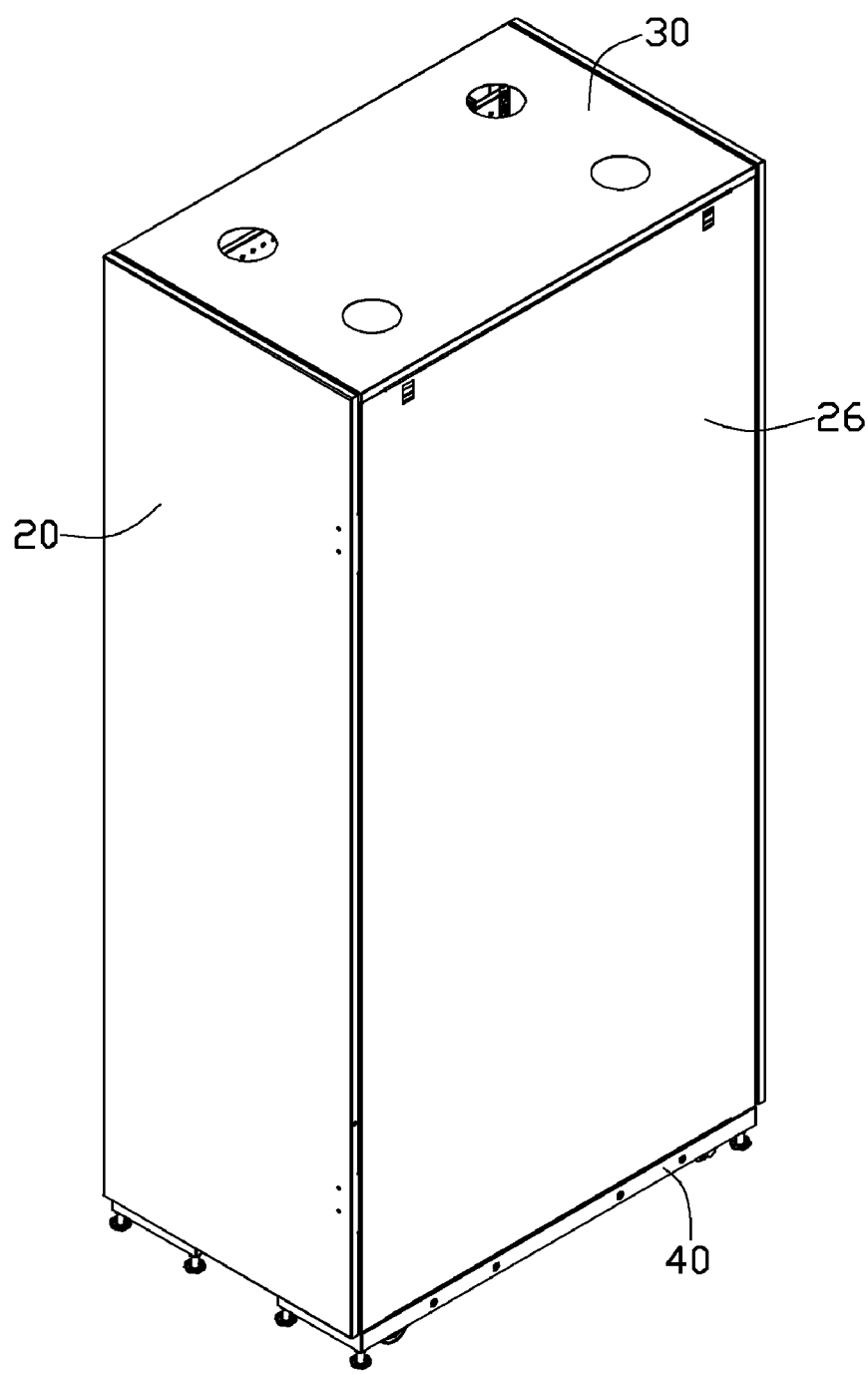
FIG. 1 is an isometric, assembled view of a switching cabinet in accordance with an embodiment.
Figure 2:
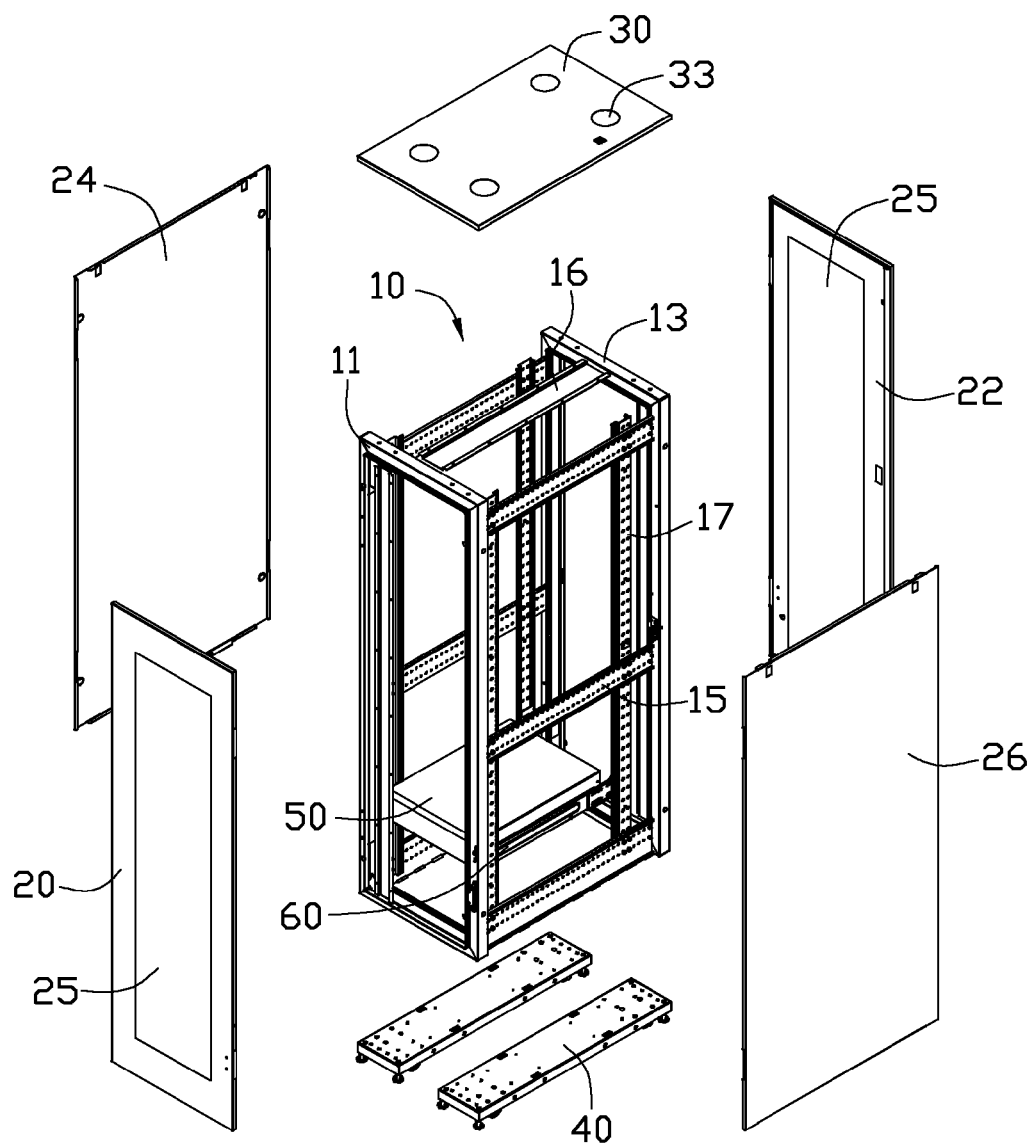
FIG. 2 is an isometric, exploded view of the switching cabinet of FIG. 1.

Referring to FIGS. 1-2, a switching cabinet is illustrated in accordance with an embodiment. The switching cabinet comprises a hollow cuboid rack 10, a top cover 30 covering a top of the rack 10, and two parallel pedestals 40 arranged at a bottom of the rack 10. Multiple wheels (not labeled) may be disposed at a bottom of each of the pedestals 40, facilitating movement of the switching cabinet. A front panel 20 is attached at the front of the rack 10, a rear panel 22 is attached at the rear of the rack 10, and two side panels 24, 26 are respectively attached at left and right sides of the rack 10. The front panel 20 and the rear panel 22 each define a vent 25 that are vertically and horizontally aligned with each other. The vents 25 promote or allow airflow through the switching cabinet.

Figure 3:
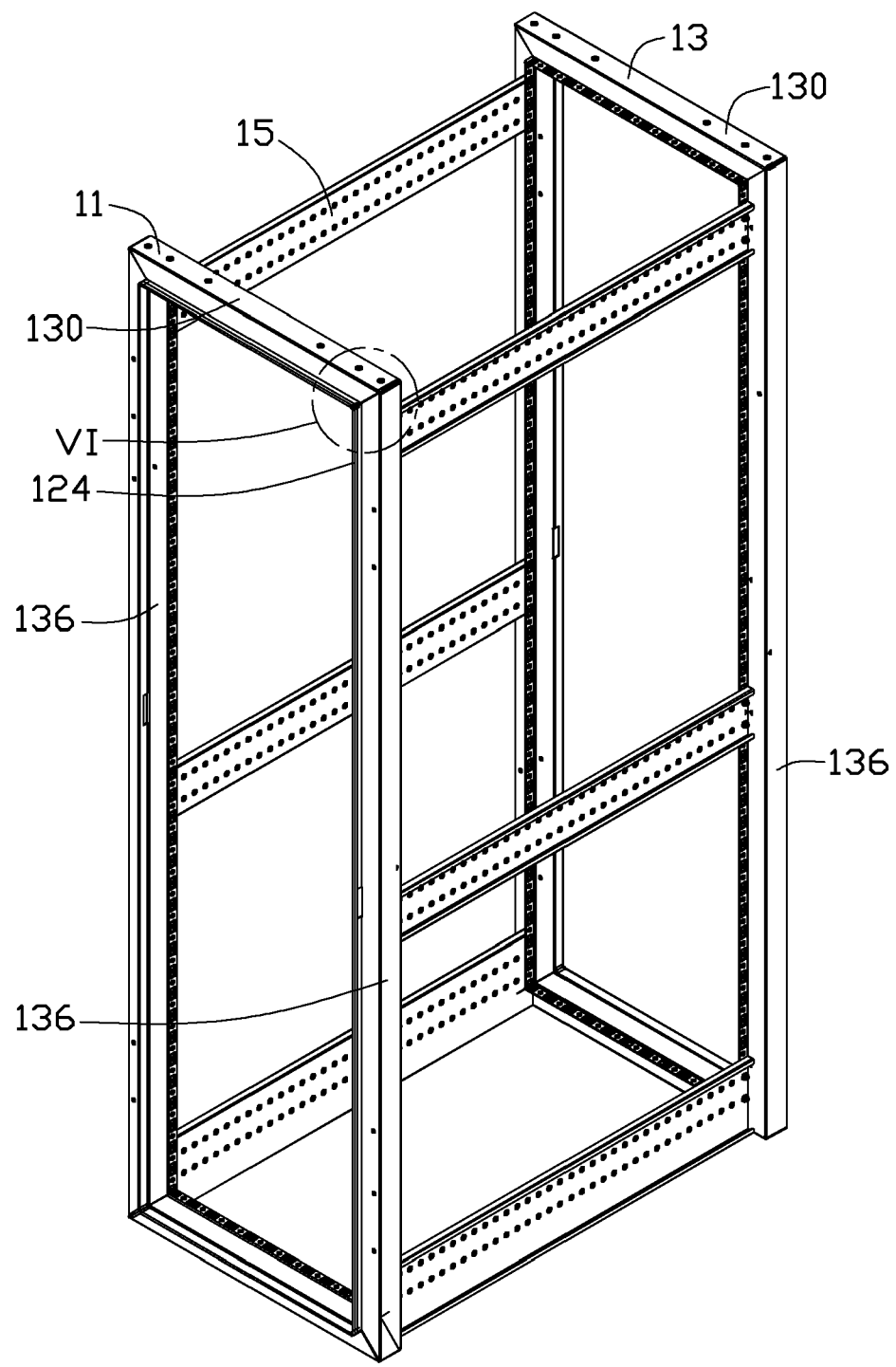
FIG. 3 is an assembled view of two frames and a plurality of beams of the rack of FIG. 2.

Referring also to FIG. 3, the rack 10 comprises a rectangular front frame 11, a rectangular rear frame 13 spaced from and parallel to the front frame 11, a plurality of beams 15 transversely secured to the front and rear frames 11, 13, and four brackets 17 vertically secured to the beams 15. Two of the brackets 17 are located at the left side of the rack 10, and the other two of the brackets 17 are located at the right side of the rack 10. The beams 15 connect the front frame 11 and the rear frame 13. In order to secure the electronic component 50 onto the brackets 17, two extendable rail assemblies 60 may be horizontally mounted on the brackets 17 located at the left side of the rack 10 and the brackets 17 located at the right side of the rack 10, respectively. In other embodiments, multiple electronic components 50 can be mounted to the brackets 17 by the extendable rail assemblies 60, and stacked vertically within the rack 10. In this embodiment, each electronic component 50 may have a fan (not shown) secured therein that can draw air from the exterior of the switching cabinet into the rack 10 via one of the vents 25 and into the components 50 then exhaust air out of the components 50 and out of the switching cabinet via the other vent 25.

The front frame 11 has the same configuration as the rear frame 13. The front frame 11 comprises two horizontal braces 130 and two vertical braces 136. The horizontal braces 130 and the vertical braces 136 are sequentially coupled together to cooperatively form the rectangular front frame 11. The horizontal braces 130 have the same shape in cross-section as the vertical braces 136.

Figure 4:
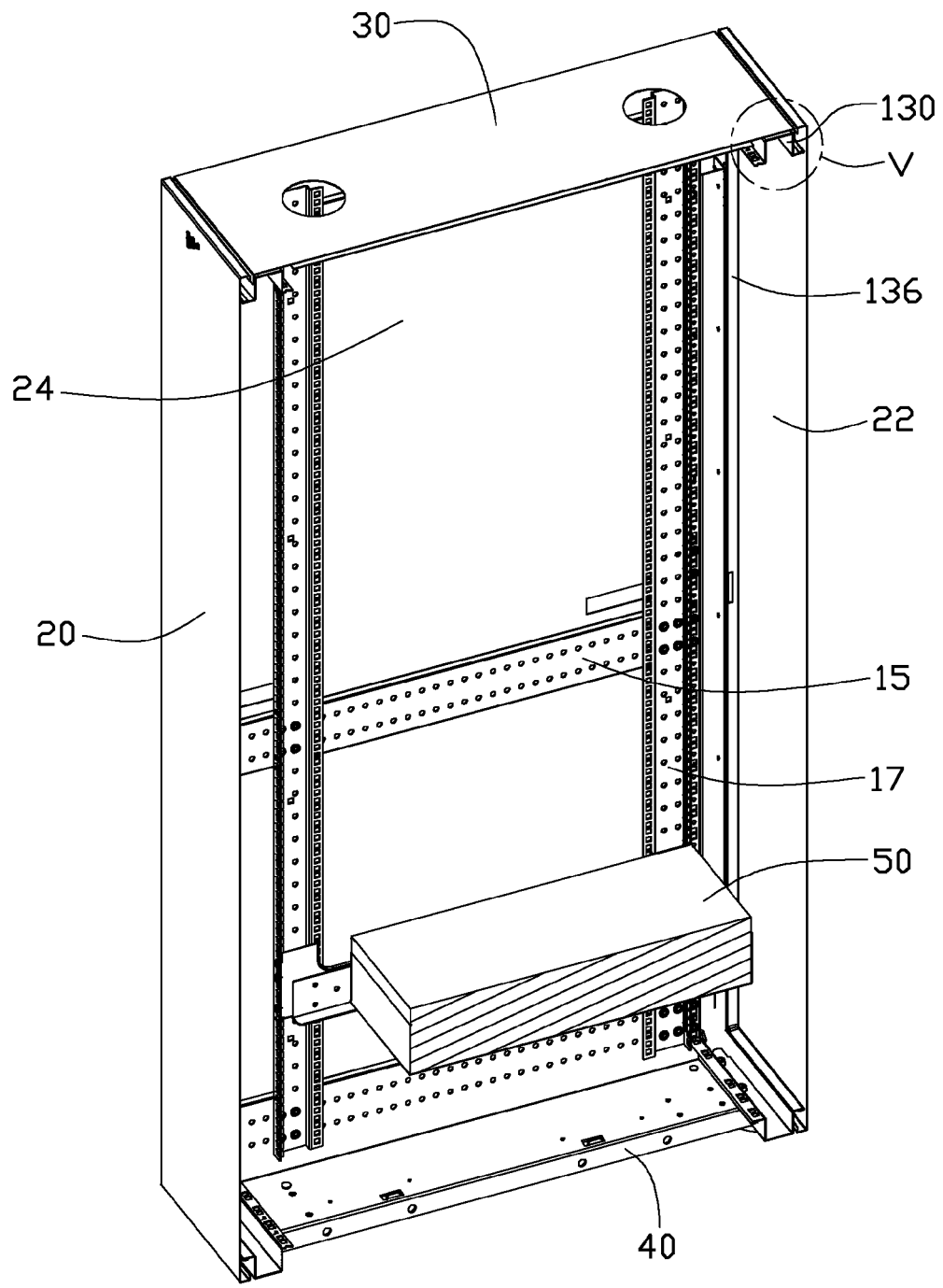
FIG. 4 is an isometric, sectional view of the switching cabinet of FIG. 1.
Figure 5:
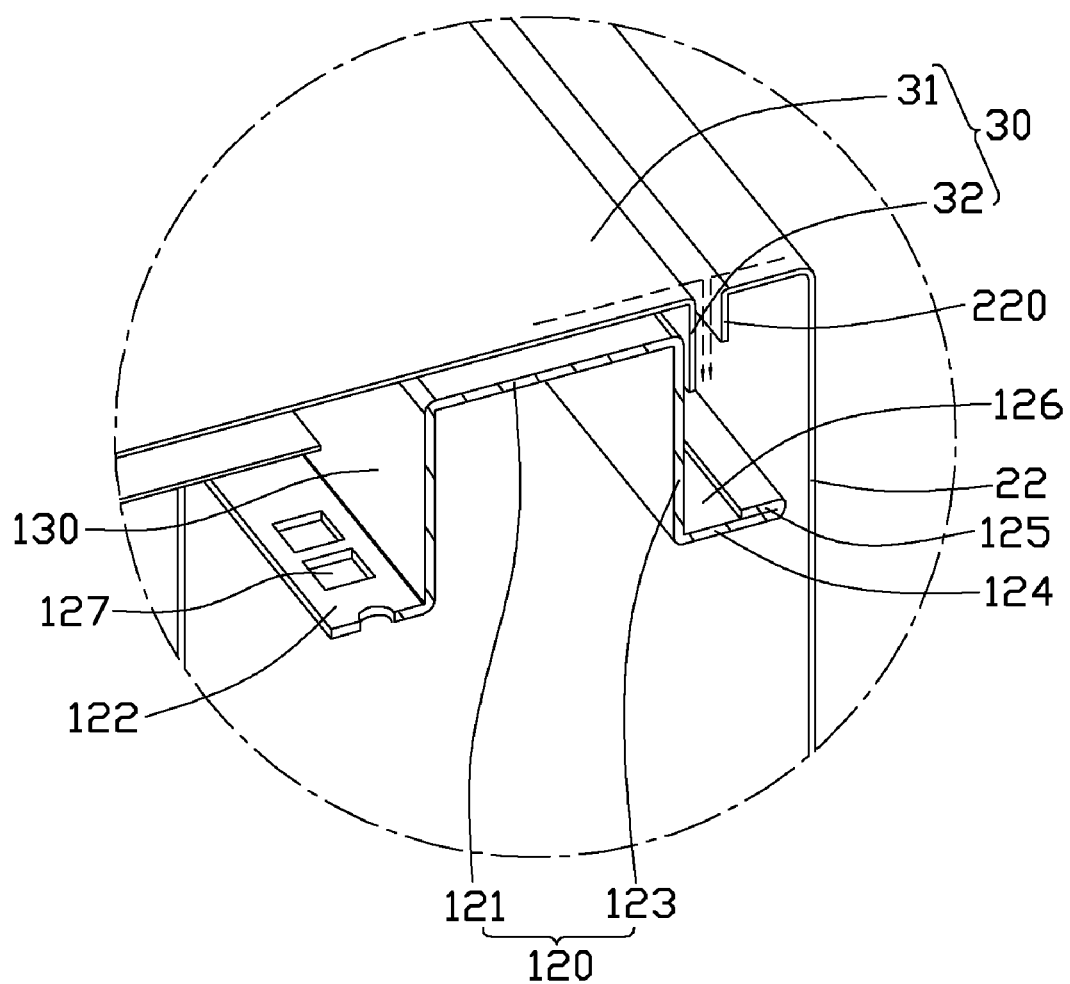
FIG. 5 is an enlarged view of a circled portion V of FIG. 4.

Referring also to FIGS. 4-5, each of the horizontal and vertical braces 130, 136 has a generally C-shaped cross-section, and comprises a main body 120. Each of the main bodies 120 has an open lateral side facing toward center of area framed by the front frame 11. Each of the main bodies 120 comprises a main plate 121, two extending plates 123 extending perpendicularly from two opposite lateral sides of the main plate 121 in a same direction, and a first flange 122 and a second flange 124 extending oppositely and outwardly from free sides of the extending plates 123. The first and second flanges 122, 124 are coplanar with each other. The ratio of the width of the main plate 121 to the width of each of the extending plates 123 is smaller than 2. In some embodiments, the ratio of the width of the main plate 121 to the width of each of the extending plates 123 may be 1 or 1.1. The first and second flanges 122, 124 are parallel to the main plate 121, and perpendicular to the extending plates 123. The first flange 122 extends towards the interior of the rack 10, and the second flange 124 extends towards the exterior of the rack 10. The first flange 122 defines a plurality of mounting holes 127 therein, for securing some elements thereon, for example, a board 16 in this embodiment is secured on the first flanges 122 of the horizontal braces 130 respectively located at tops of the front and rear frames 11, 13 when screws (not shown) extend through the board 16 and engage into the mounting holes 127. Some of the beams 15, three beams 15 in this embodiment, are secured on the first flanges 122 of two vertical braces 136 located at the left side of the rack 10. The remaining beams 15 are secured on the first flanges 122 of two vertical braces 136 located at the right side of the rack 10. Securing of the beams 15 is accomplished with screws (not shown) extended through beams 15 and engaged in the mounting holes 127.

The second flanges 124 of the horizontal and vertical braces 130, 136 each have a free side bent inwardly towards the extending plates 123 to form a baffle plate 125. In this embodiment, the baffle plates 125 are pressed to contact with the second flanges 124, thereby defining grooves 126 between inner edges of the baffle plates 125 and corresponding extending plates 123.

Figure 6:
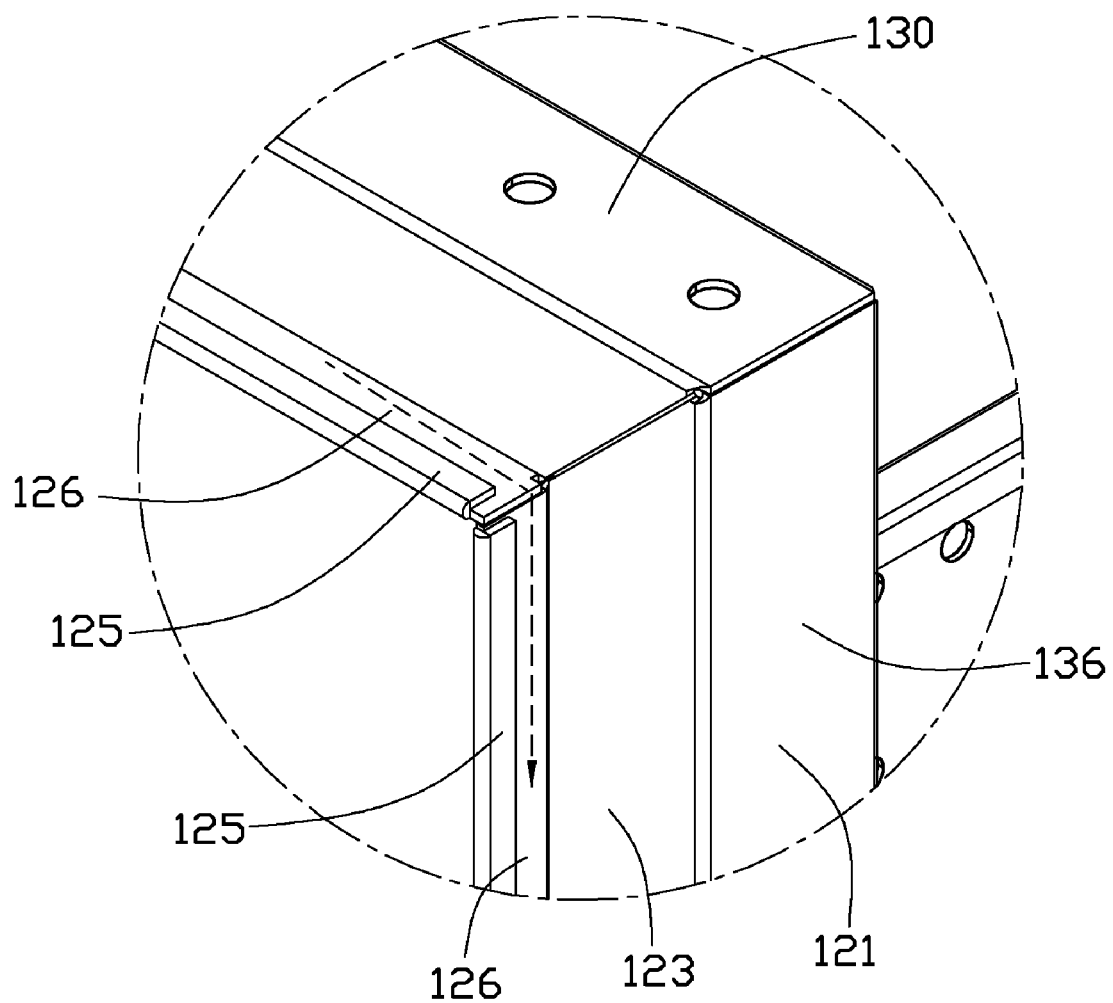
FIG. 6 is an enlarged view of a circled portion VI of FIG. 3.

The top cover 30 comprises a top board 31 and two inserting sheets 32 extending perpendicularly and downwardly from two opposite sides of the top board 31. The top board 31 defines a plurality of apertures 33. In this embodiment, multiple fans (not shown) are seated in the apertures 33, for drawing air into and venting air out of the rack 10. The inserting sheets 32 align with the grooves 126 of the horizontal braces 130 located at the tops of the front and rear frames 11, 13. When liquid such as rain drops on the top board 31, the liquid flows into the grooves 126 located at the tops of the front and rear frames 11, 13 along the inserting sheets 32. Referring also to FIG. 6, the liquid in the grooves 126 located at the tops of the front and rear frames 11, 13 flows out of the switching cabinet along the grooves 126 of the vertical braces 136, preventing the liquid from flowing into the switching cabinet thereby avoiding short circuits. In this embodiment, a guiding plate 220 is bent downwardly from a top of the rear panel 22. The guiding plate 220 guides liquid on the top of the rear panel 22 into the grooves 126 of the rear frame 13. Similarly, a guiding plate (not labeled) similar to the guiding plate 220 of the rear panel 22 is bent inwardly from a top of the front panel 20. The guiding plate of the front panel 20 guides liquid on the top of the front panel 20 into the grooves 126 of the front frame 11.

Figure 7:
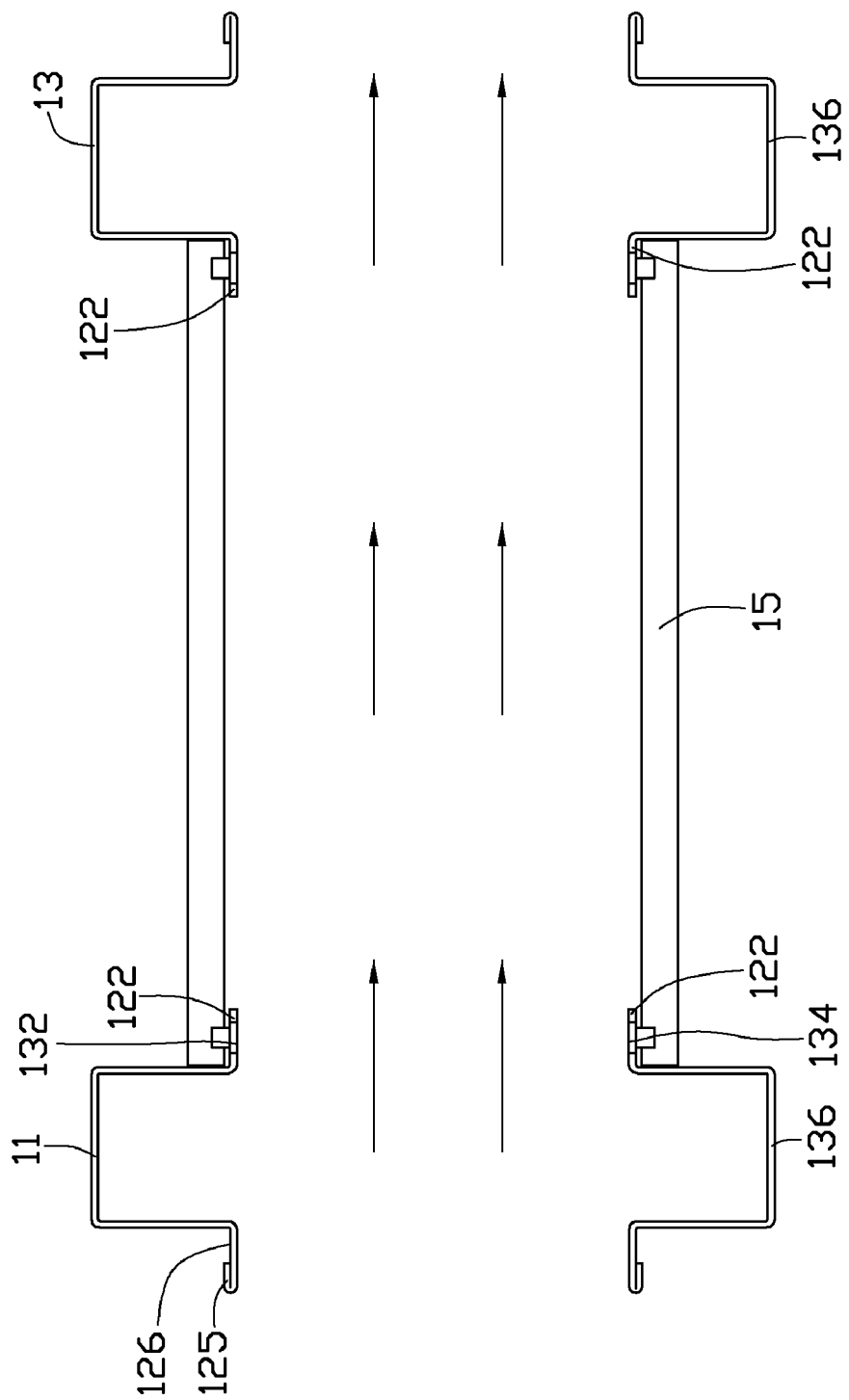
FIG. 7 is a plan view of the rack of FIG. 3, wherein the rack has top and bottom portions of the frames removed to clearly show inner structures thereof.

Referring also to FIG. 7, the first flanges 122 of two vertical braces 136 located at the left side of the rack 10 are coplanar with each other to define a first plane 132, the first flanges 122 of two vertical braces 136 located at the right side of the rack 10 are coplanar with each other to define a second plane 134, and the first plane 132 is spaced from and parallel to the second plane 134. That is, the flanges 122 of two adjacent vertical braces 136 which are respectively located at the front and the rear of the rack 10 are coplanar with each other. Due to configuration of the flanges 122, an air passage is defined between the first plane 132 and the second plane 134.

In some embodiments, the front panel 20, the rear panel 22, and the side panels 24, 26 can be omitted from the switching cabinet or only the front panel 20 and the rear panel 22 omitted according to desired design parameters. In other words, any one or more of the front panel 20, the rear panel 22 and the side panels 24, 26 can be omitted according to actual needs.

Compared with the closed cross-sections of the frame sections of the typical switching cabinet, the generally C-shaped cross-sections of the horizontal and vertical braces 130, 136 in this disclosure are lighter weight and can save cost on materials and manufacturing. In addition, although the cross-sections of the horizontal and vertical braces 130, 136 are generally C-shaped, the strength of the horizontal and vertical braces 130, 136 is substantially identical to that of the frame sections of the typical switching cabinet, when used in the same conditions.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. A switching cabinet comprising:
a rack comprising a plurality of braces, each of the braces comprising a main plate and two extending plates extending from two opposite lateral sides of the main plate in a same direction, a first flange and a second flange extending oppositely and outwardly from free sides of the extending plates, each second flange having a free side thereof bent inwardly towards the connected extending plate of the main plate to form a baffle plate, the baffle plate being in contact with the second flange, a groove being defined between an inner edge of the baffle plate and the corresponding extending plate, four of the braces acting as vertical braces and two of the braces acting as horizontal braces, the vertical braces spaced from each other, the horizontal braces spaced from each other, each of the horizontal braces secured on tops of two adjacent vertical braces, and the grooves of the horizontal braces corresponding to the grooves of the vertical braces so that liquid flows from the grooves of the horizontal braces to the grooves of the vertical braces;
a top cover covering a top of the rack, the top cover comprising a top board and two inserting sheets extending downwardly from two opposite sides of the top board, the inserting sheets corresponding to the grooves of the horizontal braces to guide liquid on the top board into the grooves; and
a front panel and a rear panel respectively covering lateral sides of the rack, a top end of the front panel bent downwardly to form a flange, a top end of the rear panel bent downwardly to form a flange, and the flanges of the front panel and the rear panel respectively located at lateral sides of the inserting sheets, spaced from the inserting sheets and corresponding to the grooves of the horizontal braces to guide liquid on the top board into the grooves.

2. The switching cabinet of claim 1, wherein the extending plates are perpendicular to the main plate of each of the braces.

3. The switching cabinet of claim 2, wherein the first and second flanges are perpendicular to the extending plates of each of the braces.

4. The switching cabinet of claim 1, wherein the first and second flanges of each of the braces are coplanar with each other.

5. The switching cabinet of claim 1, wherein the ratio of the width of the main plate to the width of each of the extending plates of each of the braces is smaller than 2.

6. The switching cabinet of claim 1, wherein two parallel pedestals connect bottom ends of the vertical braces.

7. The switching cabinet of claim 6, wherein multiple wheels are disposed at a bottom of each of the pedestals.

8. The switching cabinet of claim 1, further comprising two beams, the beams spaced from and facing each other, one of the beams located between two of the vertical braces, with opposite ends of the beam secured to said two of the vertical braces, and the other beam located between another two of the vertical braces, with opposite ends of the other beam secured to said another two of the vertical braces.

* * * * *